United States Patent
Kitahara et al.

(10) Patent No.: US 6,335,266 B1
(45) Date of Patent: Jan. 1, 2002

(54) HYDROGEN-DOPED POLYCRYSTALLINE GROUP IV-BASED TFT HAVING A LARGER NUMBER OF MONOHYDRIDE-IV BONDS THAN HIGHER ORDER-IV BONDS

(75) Inventors: Kuninori Kitahara; Satoshi Murakami; Akito Hara, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/570,684

(22) Filed: May 15, 2000

Related U.S. Application Data

(62) Division of application No. 09/034,582, filed on Mar. 4, 1998.

(30) Foreign Application Priority Data

Sep. 4, 1997 (JP) .............................. 9-239752

(51) Int. Cl.$^7$ ............................................ H01L 21/322
(52) U.S. Cl. ...................... 438/475; 438/488; 438/602; 438/483
(58) Field of Search ................. 438/475, 483, 438/488, 602; 257/65, 66

(56) References Cited

U.S. PATENT DOCUMENTS

| | | | |
|---|---|---|---|
| 4,740,829 A | * 4/1988 | Nakagiri | 257/65 |
| 4,814,842 A | 3/1989 | Nakagawa et al. | 357/23.7 |
| 5,543,336 A | * 8/1996 | Enami et al. | 438/528 |
| 5,923,967 A | * 7/1999 | Yamamoto | 438/162 |

FOREIGN PATENT DOCUMENTS

JP    621459    1/1994

* cited by examiner

Primary Examiner—Charles Bowers
Assistant Examiner—Hsien-Ming Lee
(74) Attorney, Agent, or Firm—Greer, Burns & Crain, Ltd.

(57) ABSTRACT

A polycrystalline semiconductor material containing Si, Ge or SiGe, wherein the material contains H atoms and the number of monohydride structures of couplings between Si or Ge, and H is larger than the number of higher-order hydride structures, or in other words, a peak intensity of a monohydride structure in a local vibration mode measured by a Raman spectral analysis is higher than a peak intensity of a higher-order hydride structure. By configuring the compositions of a polycrystalline semiconductor material in the above manner, the carrier mobility can be made high.

9 Claims, 7 Drawing Sheets

HYDROGEN-DOPED POLYCRYSTALLINE GROUP IV-BASED TFT HAVING A LARGER NUMBER OF MONOHYDRIDE-IV BONDS THAN HIGHER ORDER-IV BONDS

This is a divisional, of application Ser. No. 09/034,582, filed Mar. 4,1998.

This application is based on Japanese Patent Application No. 9-239752 filed on Sep. 4, 1997, the entire contents of which are incorporated herein by reference.

BACKGROUND OF THE INVENTION a) Field of the Invention

The present invention relates to polycrystalline semiconductor material suitable for acquiring a large carrier mobility, its manufacture method, semiconductor devices using such material, and its evaluation method.

Amorphous silicon has been used as a material of a channel layer of a thin film transistor (TFT) used for active matrix type liquid crystal display panels. If amorphous silicon is replaced by polysilicon, carrier mobility in the channel can be made high. As the carrier mobility becomes higher, the maximum drive current of a transistor becomes large. It is therefore possible to reduce the area occupied by TFT in each pixel area of a liquid crystal display panel and make the aperture ratio high. It is also possible to increase the number of pixels per unit area of a substrate and to realize a high precision liquid crystal display panel.

b) Description of the Related Art

A polysilicon layer contains grain boundaries and grain defects which form localized states (localized level). These localized states lower carrier mobility or increase leakage current so that the performance of a semiconductor device is degraded. It is known that if hydrogen atoms are doped in a polysilicon layer, grain boundaries and grain defects are made electrically inactive and the performance of the semiconductor device is improved (JP-A-62-84562).

Known methods of doping hydrogen atoms into a polysilicon layer include exposing the polysilicon layer to hydrogen plasma (JP-A-63-46775), forming an $SiO_2$ film or SiN film containing hydrogen atoms on the polysilicon layer and heating it (JP-A-6-314697, JP-A-8-32077), and heating the polysilicon layer in hydrogen gas (JP-A-63-200571).

Although these conventional methods can increase carrier mobility in a polycrystalline semiconductor layer to some degree, technologies of forming a polycrystalline semiconductor layer having a much larger carrier mobility have been long desired.

SUMMARY OF THE INVENTION

It is an object of the present invention to provide polycrystalline semiconductor material capable of increasing carrier mobility, its manufacture method, semiconductor devices using such material, and its evaluation method.

According to one aspect of the present invention, there is provided a polycrystalline semiconductor material essentially comprising Si, Ge or SiGe, wherein the material contains H atoms and the number of monohydride structures of couplings between Si or Ge, and H is larger than the number of higher-order hydride structures.

According to another aspect of the present invention, there is provided a polycrystalline semiconductor material essentially comprising Si, Ge or SiGe, wherein the material contains H atoms and a peak intensity of a monohydride structure in a local vibrator mode measured by a Raman spectral analysis is higher than a peak intensity of a higher-order hydride structure.

According to another aspect of the present invention, there is provided a method of forming a polycrystalline semiconductor layer, comprising the steps of: forming a polycrystalline semiconductor layer essentially comprising Si, Ge or SiGe, on a support substrate; and adding hydrogen to the polycrystalline semiconductor layer so that the number of monohydride structures of couplings between Si or Ge, and H is larger than the number of higher-order hydride structures.

According to another aspect of the present invention, there is provided a method of forming a polycrystalline semiconductor layer, comprising the steps of: forming a polycrystalline semiconductor layer essentially comprising Si, Ge or SiGe, on a support substrate; adding hydrogen to the polycrystalline semiconductor layer; and dissociating hydrogen in the polycrystalline semiconductor layer added with hydrogen by heating the polycrystalline semiconductor layer so that the number of monohydride structures of couplings between Si or Ge, and H is larger than the number of higher-order hydride structures.

With the structures described above, a polycrystalline semiconductor layer having a high carrier mobility can be formed.

According to another aspect of the present invention, there is provided a semiconductor device comprising: a support substrate having an insulating surface; a polycrystalline semiconductor layer formed on the insulating surface of the support substrate, the polycrystalline semiconductor material essentially comprising Si, Ge or SiGe, wherein the material contains H atoms and the number of monohydride structures of couplings between Si or Ge, and H is larger than the number of higher-order hydride structures; a gate insulating film formed on a local surface area of the polycrystalline semiconductor layer; a gate electrode formed on the gate insulating film; and a source electrode and a drain electrode in ohmic contact with the polycrystalline semiconductor layer on both sides of the gate insulating film respectively.

With this structure, a TFT having a high electric field mobility can be formed.

According to another aspect of the present invention, there is provided a method of evaluating a semiconductor device comprising the steps of: irradiating a laser beam to a channel region of a thin film transistor formed on the surface of a transparent substrate, the channel region essentially comprising Si, Ge or SiGe; and comparing a peak intensity of a monohydride structure of couplings between Si or Ge, and H with a peak intensity of a higher-order hydride structure, through observation of spectra of light scattered from the channel region.

By comparing a peak intensity of the monohydride structure with a peak intensity of the higher-order hydride structure, carrier mobility in the channel region can be estimated.

As described above, carrier mobility can be made high by controlling the addition of hydrogen to a polycrystalline semiconductor material. By forming a TFT using such polycrystalline semiconductor material, TFT having a high electric field mobility can be realized with improved off-current characteristics, threshold value and the like.

DETAILED DESCRIPTION OF THE PREFERRED EMBODIMENTS

Embodiments of the invention will be described by taking a polysilicon layer as an example.

The present inventors have studied the relationship between hydrogenating process time and a carrier mobility in a polysilicon layer hydrogenated by exposing it in hydrogen plasma.

Figure 1:
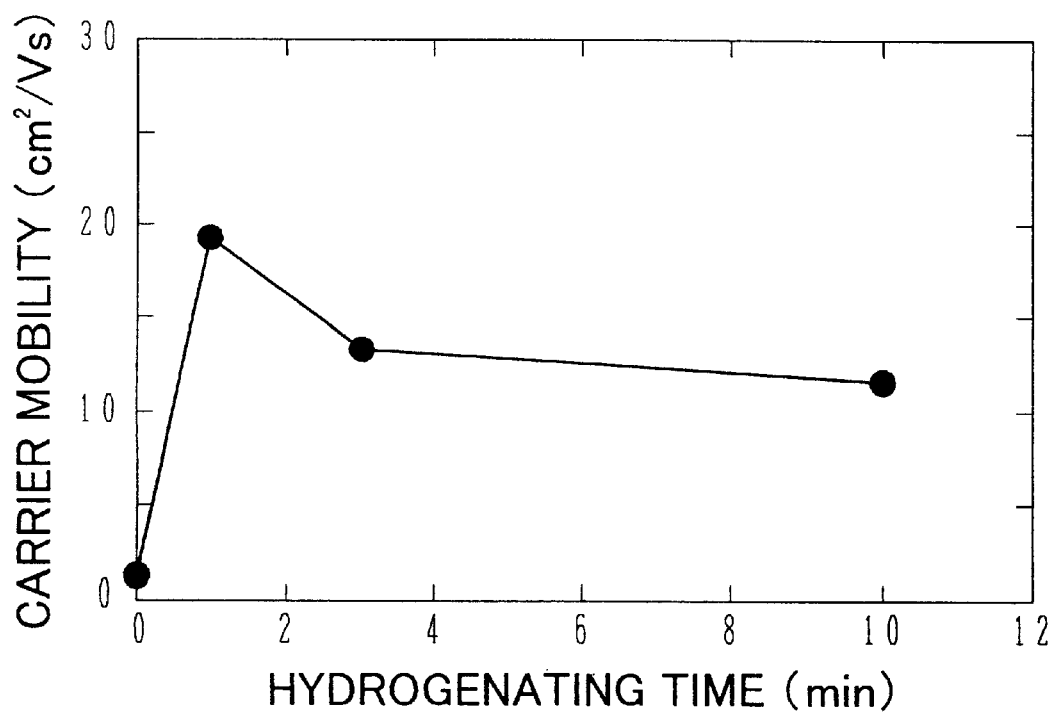
FIG. 1 is a graph showing carrier mobility in a polysilicon layer as a function of hydrogenating time.

FIG. 1 is a graph showing the relationship between carrier mobility in a polysilicon layer and hydrogenating time. The abscissa represents a hydrogenating time in units of minutes, and the ordinate represents carrier mobility in the unit of $cm^2/Vs$. The carrier mobility was measured by the Hall effect of a polysilicon layer doped with phosphorous at a dose of $5\times10^{13}$ $cm^{-2}$. The conduction type measured by the Hall effect was n type. The hydrogenating process was performed in a diode parallel plate plasma-enhanced chemical vapor deposition (PE-CVD) system. Two parallel electrodes had a diameter of 10 cm (4 inches), and a radio frequency power of 30 W (at a frequency of 13.56 MHz) was applied across the electrodes, at a hydrogen gas pressure of 300 mTorr and a substrate temperature of 350° C.

As shown in FIG. 1, the hydrogenating process of about 1 minute raises the carrier mobility from about 1.5 $cm^2/Vs$ to about 20 $cm^2/Vs$. However, when the hydrogenating process is performed for longer than 1 minute, the carrier mobility lowers gradually.

Figure 2:
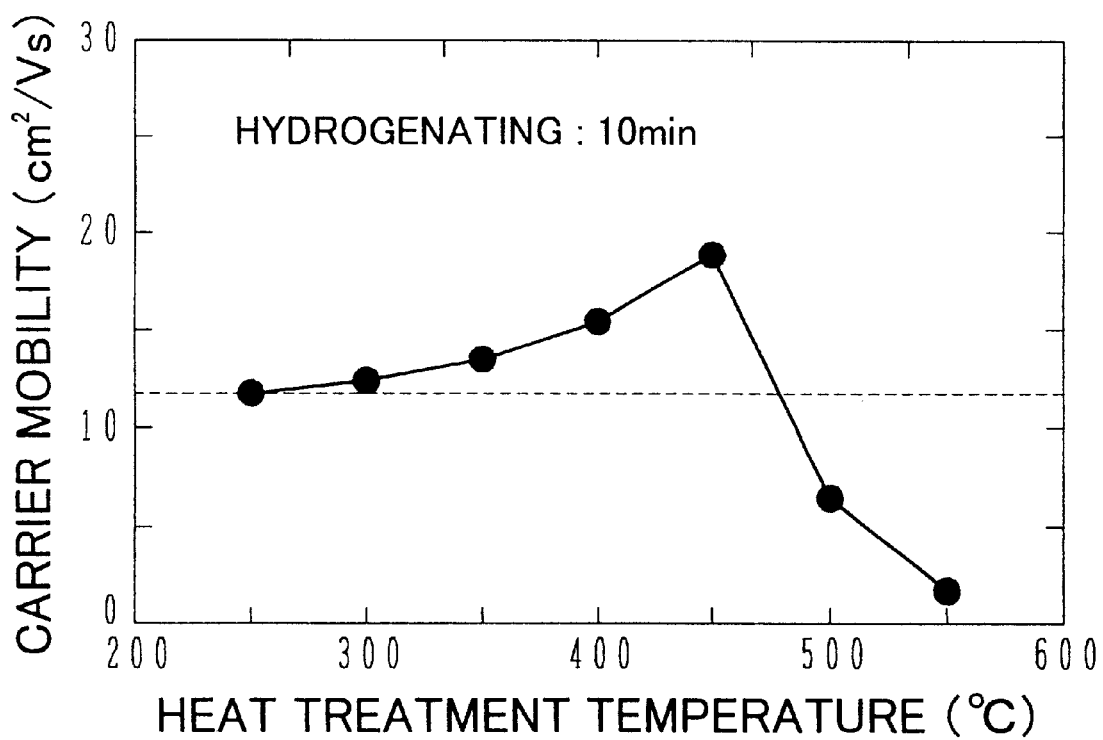
FIG. 2 is a graph showing carrier mobility in a polysilicon layer as a function of heat treatment temperature after a hydrogenating process.

FIG. 2 is a graph showing the relationship between carrier mobility and heat treatment temperature, of a polysilicon layer hydrogenated for 10 minutes. The abscissa represents heat treatment temperature in the unit of °C., and the ordinate represents carrier mobility in the unit of $cm^2/Vs$. The heat treatment time at each temperature was set to 10 minutes. The carrier mobility before the heat treatment is indicated by a broken line.

In the range of 250° C. to 450° C. of the heat treatment temperature, the carrier mobility rises as the heat treatment temperature rises. In the range of 400° C. to 500° C., there is a peak of the carrier mobility, and at the temperatures higher than this range, the carrier mobility lowers sharply.

A polysilicon layer was evaluated by the Raman scattering method in order to investigate how the hydrogenating time and heat treatment temperature functions as factors of changing the carrier mobility.

Figure 3:
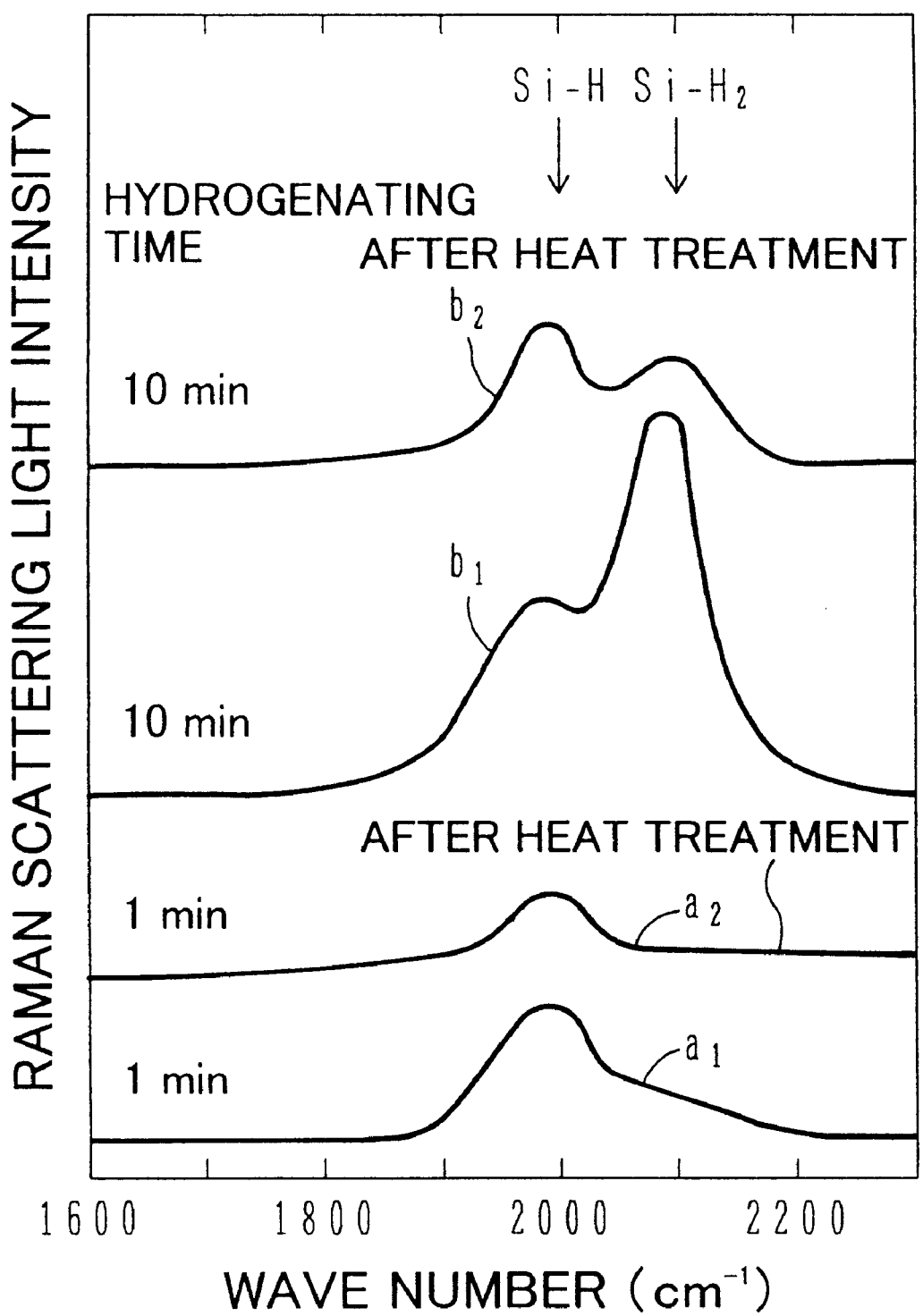
FIG. 3 is a graph showing Raman spectra of a polysilicon layer.

FIG. 3 shows Raman scattering spectra of polysilicon layers. The abscissa represents a wave number in the unit of $cm^{-1}$, and the ordinate represents a Raman scattering intensity in an arbitrary scale. Curves $a_1$ and $a_2$ show spectra of a polysilicon layer hydrogenated for 1 minute, whereas curves $b_1$ and $b_2$ show spectra of a polysilicon layer hydrogenated for 10 minutes. The curves $a_1$ and $b_1$ show the Raman scattering spectra before heat treatment, whereas the curves $a_2$ and $b_2$ show the Raman scattering spectra after heat treatment at 450° C. for 10 minutes.

A peak near a wave number of 2000 $cm^{-1}$ corresponds to a local vibration mode of Si—H bonding (monohydride structure), and a peak near a wave number of 2090 $cm^{-1}$ corresponds to a local vibration mode of Si—$H_2$ bonding (second order hydride structure).

The curves $a_1$ and $b_1$ correspond to the hydrogenating times of 1 minute and 10 minutes respectively shown in FIG. 1. It is supposed that high carrier mobility is obtained when the peak of the monohydride structure only obviously appears and the peak of the second-order hydride structure is extremely small, and that the carrier mobility lowers as the peak of the second-order hydride structure becomes large.

It can be understood from the comparison between the curves $a_1$ and $a_2$ and the curves $b_1$ and $b_2$ that the heat treatment lowers the intensity of a peak. This is because the heat treatment decouples hydrogen atoms of the hydride structure. It can also be understood from the comparison between the curves $b_1$ and $b_2$ that the reduction amount of a peak intensity of the second-order hydride structure is larger than that of a peak intensity of the monohydride structure. This is because a dissociation energy of the second-order hydride structure is smaller than that of the monohydride structure.

As described with FIG. 2, the reason why the carrier mobility is made high by heat treatment may be ascribed to that the peak intensity of the second-order hydride structure is lowered much more than that of the monohydride structure. It is therefore conceivable that in order to make a carrier mobility high, the polysilicon layer is preferably configured so that the peak intensity at the monohydride structure becomes larger than the peak intensities of the second- and higher-order hydride structures.

Since the peak intensity of a Raman scattering spectrum is considered to be proportional to the number of hydride structures, the above-described preferable configuration is equivalent to the configuration in which the number of monohydride structures is larger than that of second- and higher-order hydride structures.

As shown in FIG. 2, the carrier mobility lowers if the heat treatment temperature is set too high. This may be ascribed to the progression of dissociation of the monohydride structure.

The heat treatment time was set to 10 minutes in the experiments shown in FIG. 2. In this case, the heat treatment temperature of about 450° C. is preferable. The preferable heat treatment temperature range changes with the heat treatment time, and vice versa.

Figure 4:
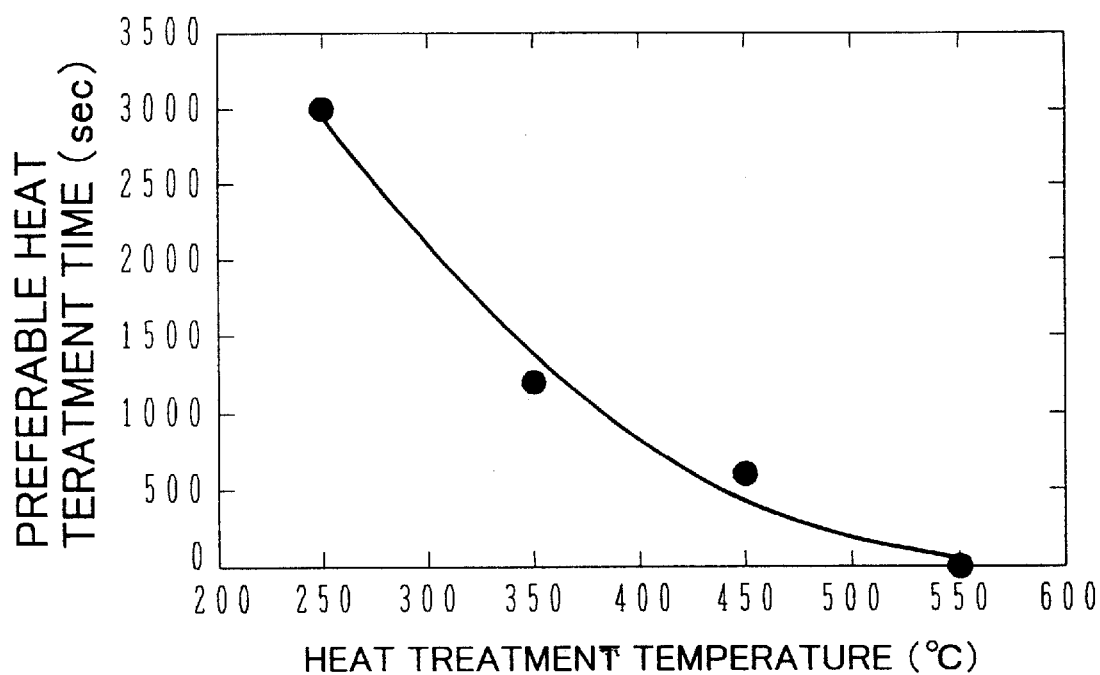
FIG. 4 is a graph showing the relationship between heat treatment temperature after a hydrogenating process and preferable heat treatment time.

FIG. 4 shows the relationship between the heat treatment temperature and a preferable heat treatment time. At the heat treatment temperature of 250° C., the preferable heat treatment time is about 3000 seconds. As the heat treatment time prolongs, the preferable heat treatment time shortens. If the heat treatment temperature is too low, the preferable heat treatment time prolongs, resulting in low productivity. Conversely, if the heat treatment temperature is too high, the preferable heat treatment time shortens, resulting in difficulty of stable heat treatment control. Therefore, the heat treatment temperature is preferably set to 250° C. to 500° C.

The configuration of a polysilicon layer is preferably set so that the number of monohydride structures is larger than that of higher-order hydride structures. Even if the former is not larger than the latter, the effect of raising the carrier mobility can be expected if the heat treatment after the hydrogenating process reduces the number of higher-order hydride structures much more than that of monohydride structures.

Next, with reference to FIGS. 5A to 5G, a thin film transistor formed by incorporating the above-described embodiment method of forming a polysilicon layer will be described.

Figure 5A:
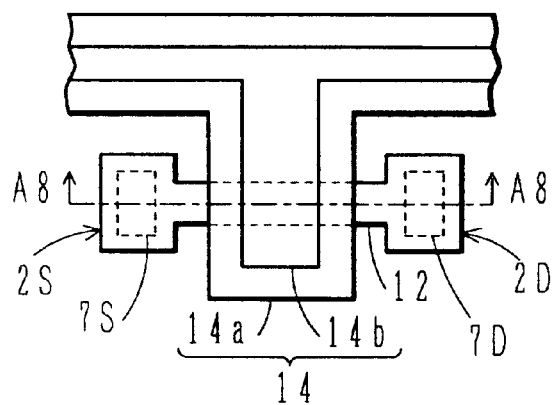
FIG. 5A is a plan view illustrating a method of forming TFT by using a silicon layer formed by the embodiment method.

Fig. 5A is a plan view briefly showing a thin film transistor. On a glass substrate, a polysilicon film 12 is disposed extending in the horizontal direction in Fig. 5A. At generally the central portion of the polysilicon film 12 in its longitudinal direction, a gate electrode 14 is disposed cross the polysilicon film 12. One end of the gate electrode 14 is continuous with a gate line extending in the horizontal direction. The gate electrode 14 and the gate line are each constituted of a low resistance film 14b made of Al and an anodic oxidation film 14a surrounding the side walls of the low resistance film 14b.

Figure 5B:
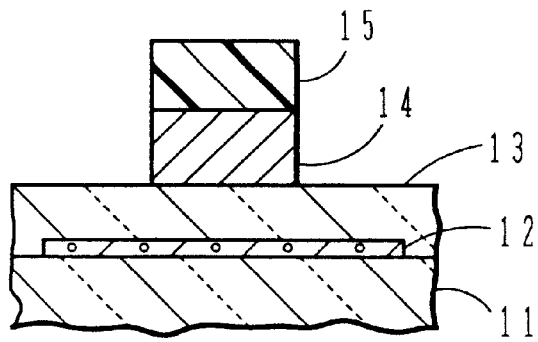
FIGS. 5B to 5G are cross sectional views illustrating each process, taken along a one-dot chain line A8—A8 of FIG. 5A.

FIGS. 5B to SG are cross sectional views taken along one-dot chain line A8—A8 of FIG. 5A, illustrating each manufacture process.

As shown in FIG. 5B, on the glass substrate 11, an amorphous silicon layer is deposited to a thickness of about 50 nm. An excimer laser beam is irradiated to polycrystallize the amorphous silicon layer. The excimer laser beam may be a xenon chloride (XeCl) excimer laser having a wavelength of 308 nm, an energy density of about 300 mJ/cm$^2$, a pulse repetition frequency of 100 Hz, and a radiation time of 10 ns per one pulse. The laser exposure area is an elongated area, for example, a width of 1 mm and a length of 100 mm. The laser beam is moved by 0.1 mm per one pulse in the width direction to apply it to a broad area. The polysilicon layer polycrystallized from the amorphous silicon layer having such a thickness has generally one grain in its thickness direction. The polycrystallized silicon layer has an average grain diameter of about 100 nm.

The polycrystallized silicon layer is patterned to form a polysilicon film 12. An SiO$_2$ film as a diffusion barrier layer may be formed between the glass substrate 11 and polysilicon film 12. The polycrystallized silicon layer may be patterned through dry etching using Cl$_2$ containing gas.

A gate insulating film 13 of about 120 nm thick is deposited over the whole surface of the substrate 11, covering the polysilicon film 12. The gate insulating film 13 may be deposited by PE-CVD using SiH$_4$ and N$_2$O.

On the gate insulating film 13, an Al film of a thickness of about 350 nm is deposited by sputtering. On this Al film, a resist pattern 15 is formed which has the same pattern as the gate electrode 14 crossing the polysilicon film 12 as shown in FIG. 5A. By using the resist pattern 15 as an etching mask, the Al film is patterned through dry etching using Cl$_2$ containing gas, to leave the gate electrode 14 in the area covered with the resist pattern 15.

Figure 5C:
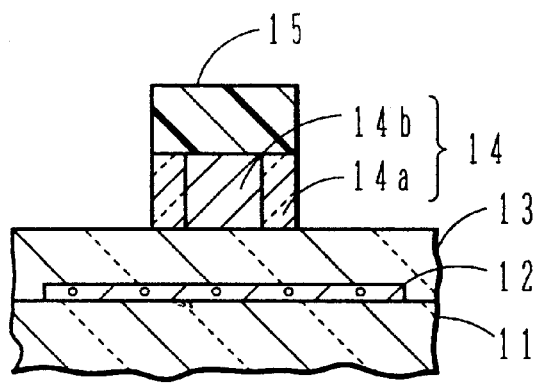

As shown in FIG. 5C, by using the resist pattern 15, the exposed surface of the gate electrode 14 is anodically oxidized. Therefore, the low resistance film 14b made of Al is left in the gate electrode 14, and the anodic oxidation film 14a of about 1 to 2 μm thick is formed on the side walls of the low resistance film 14b. The anodic oxidation is carried out in aqueous solution containing oxalic acid as its main component. After the anodic oxidation, the resist pattern 15 is removed.

Figure 5D:
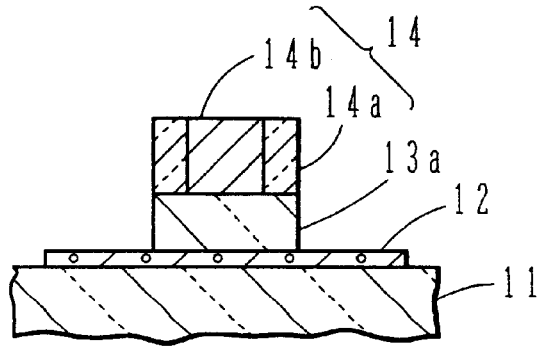

As shown in FIG. 5D, by using the gate electrode 14 as a mask, the gate insulating film 13 is etched to leave the gate insulating film 13a only just under the gate electrode 14. The gate insulating film 13 may be etched through dry etching using fluorine containing gas. Portions of the surface of the polysilicon film 12 on both sides of the gate insulating film 13a are therefore exposed.

Figure 5E:
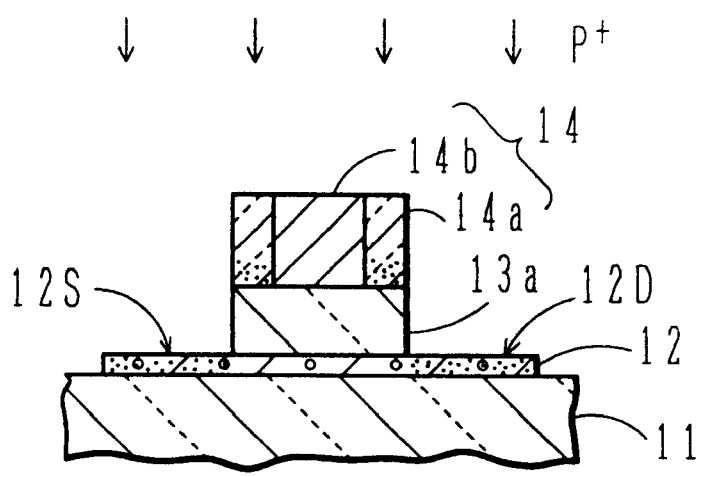

As shown in FIG. 5E, P$^+$ions are implanted over the entire substrate surface, and a laser beam is irradiated to anneal and activate the implanted ions. The dose is set such that the sheet resistance of the ion doped region of the polysilicon film 12 becomes about 1 kΩ/□ or lower. n$^+$-type source and drain regions 12S and 12D are therefore formed in the polysilicon film 12 in the exposed regions on both sides of the gate insulating film 13a.

With the processes illustrated in FIGS. 5B to 5E, the source region 12S, drain region 12D, and gate electrode 14 are formed. The gate electrode 14 is constituted of the low resistance film 14b made of Al and the high resistance film 14a on the sides of the source and drain regions 12S and 12D.

Figure 5F:
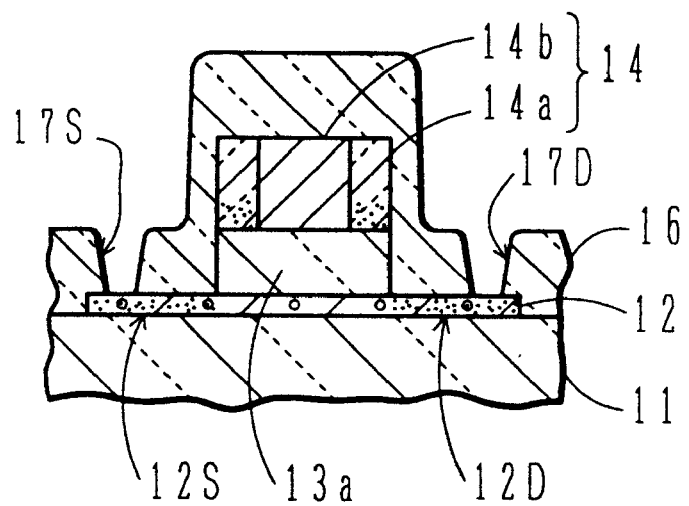

As shown in FIG. 5F, an interlayer insulating film 16 is deposited over the entire surface of the substrate. The interlayer insulating film 16 is a lamination of an SiO$_2$ film about 30 nm thick and an SiN film about 270 nm thick deposited in this order. The SiO$_2$ film may be deposited by PE-CVD using SiH$_4$ and N$_2$O as source gas at a growth temperature of 300° C. The SiN film may be deposited by PE-CVD using SiH$_4$ and NH$_3$ as source gas at a growth temperature of 300° C.

Contact holes 17S and 17D are formed in the interlayer insulating film 16 to expose the partial areas of the surfaces of the source and drain regions 12S and 12D. The SiN film may be etched through dry etching using fluorine containing gas, and the SiO$_2$ film may be etched through wet etching using buffered fluoric acid which is a mixture of NH$_4$F, HF, and H$_2$O.

Figure 5G:
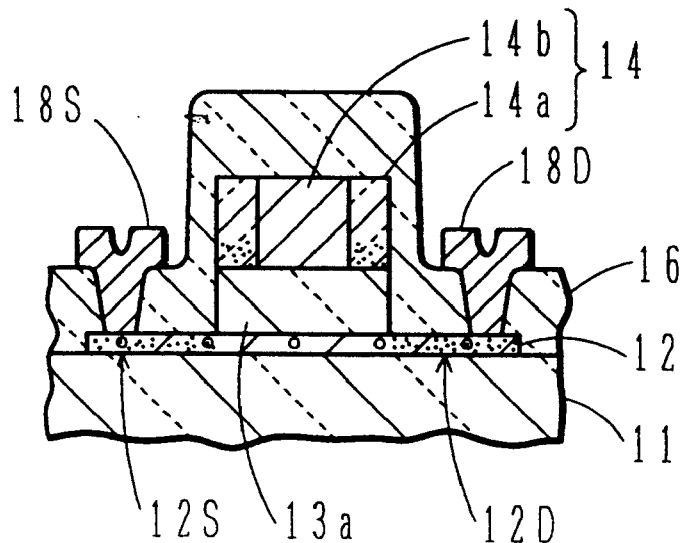

As shown in FIG. 5G, a Ti film about 50 nm thick and an Al film about 300 nm thick are laminated in this order over the entire substrate surface. This lamination structure is patterned to form a source lead wire 18S connected to the source region 12S and a drain lead wire 18D connected to the drain region 12D. The Ti and Al films may be etched through dry etching using chlorine containing gas.

Thereafter, the polysilicon layer 12 is hydrogenated by the embodiment method mentioned above. In the embodiment described previously, the polysilicon layer is directly exposed to hydrogen plasma. However, in this case, since a hydrogenating process is performed after the TFT structure is formed, the polysilicon layer 12 is exposed to hydrogen plasma via the gate insulating film 13a, interlayer insulating film 16 and the like. It is therefore necessary to prolong the hydrogenating process time.

Figure 6:
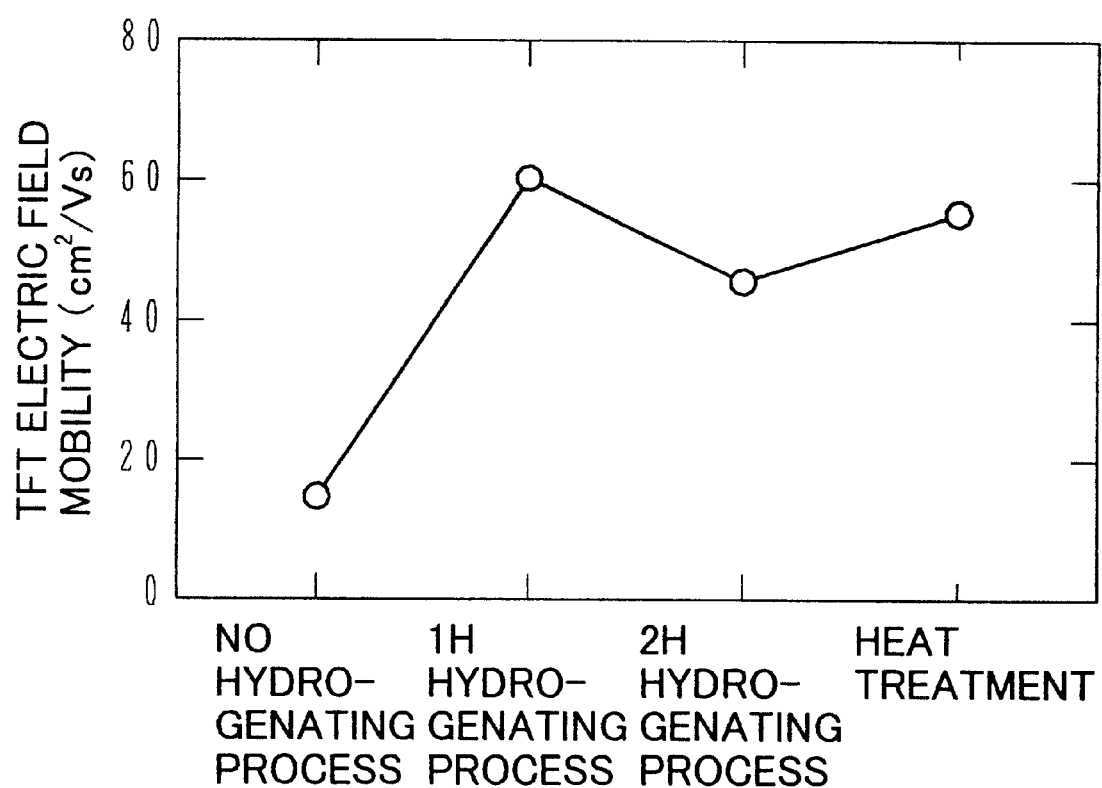
FIG. 6 is a graph showing a TFT electric field mobility.

FIG. 6 shows the electric field mobility of TFT shown in Fig. 5G. The electric field mobility is obtained from the current—voltage characteristics of TFT. The abscissa represents, sequentially from the left, no hydrogenating process, one-hour hydrogenating process, two-hour hydrogenating process, and heat treatment at 400° C. for 10 minutes after a two-hour hydrogenating process. The ordinate represents an electric field mobility of TFT in the unit of cm$^2$/Vs.

When a one-hour hydrogenating process is performed, the electric field mobility rises to 60 cm$^2$/Vs. When a two-hour hydrogenating process is performed, the electric field mobility lowers somewhat from that of the one-hour hydrogenating process, and takes a value of 45 cm$^2$/Vs. When the heat treatment is performed thereafter, it rises to 55 cm$^2$/Vs.

The advantageous effects of the embodiment provide not only a rise of electric field mobility but also a reduction of an off-current and a fall of a threshold value. Since variation of the off-current and the threshold value are reduced, the manufacture yield rate of liquid crystal display devices with TFTs is improved.

Evaluation of the polysilicon film 12 of TFT shown in FIG. 5G can be performed by the microscopic Raman scattering method by which a laser beam is irradiated to a specimen via a microscope and spectra of light scattered from the specimen are observed with the microscope. Use of the microscopic Raman scattering method allows to evaluate a localized micro area, and provides a surface resolution of about 1 μm. An argon ion laser (wavelength of 514.5 nm) was used.

Since the upper surface of the polysilicon film 12 is covered with an electrode and a wiring metal, the laser beam is applied from the bottom of the glass substrate 11. Since the glass substrate is about 1 mm thick and has a large refractive index, it is preferable to use, as an object lens of the microscope, a long-focus lens which is sold in markets for use with liquid crystal display devices.

When a laser beam is applied from the bottom of the glass substrate 11, the intensity of rear light becomes strong. It is therefore necessary to compensate the background of observed spectra for this rear light. The polysilicon film 12 was evaluated by the method described so far. The evaluation showed a correlation between electric field mobility and relative intensity between a peak of the monohydride structure and a peak of the higher-order hydride structure, similar to the mobility measured by the Hall effect.

A specimen can be evaluated non-destructively by using the microscopic Raman scattering method, so that a silicon layer can be evaluated at any time during the manufacturing processes of liquid crystal display devices. The characteristics of TFT can be estimated in accordance with the evaluation results, more specifically, with the comparison results between the peak intensity of the monohydride structure and that of the higher-order hydride structure. If it is judged that desired characteristics cannot be attained, the hydrogenating process or the heat process may be performed again to improve the manufacture yield rate.

In the embodiment shown in FIGS. 5A to 5G, the hydrogenating process is performed at the process of FIG. 5G after the TFT is completed. This hydrogenating process may be performed after a polysilicon film is formed and before TFT is completed.

In the above embodiment, a polysilicon layer has been described. The invention is also applicable to a polycrystalline germanium (Ge) layer and a polycrystalline silicon-germanium (SiGe) layer.

Further, in the above embodiment, although the hydrogenating process is performed by exposing a polysilicon layer to hydrogen plasma, other hydrogenating processes may be used if the number of monohydride structures becomes larger than the number of higher-order hydride structures. For example, doping of hydrogen ions, doping of impurity ions which contain hydrogen, diffusion of hydrogen atoms from an insulating film deposited on a polysilicon layer, and other methods may also be used.

The heat treatment after the hydrogenating process may be performed either in a nitrogen atmosphere or in an atmosphere of hydrogen or hydrogen diluted with nitrogen. A hydrogen atmosphere for the heat treatment may make the monohydride structure difficult to be dissociated. An atmosphere containing oxygen or water contents for the heat treatment is expected to oxidize and inactivate grain boundaries.

The present invention has been described in connection with the preferred embodiments. The invention is not limited only to the above embodiments. It is apparent that various modifications, improvements, combinations, and the like can be made by those skilled in the art.

What is claimed is:

1. A method of forming a polycrystalline semiconductor layer, comprising the steps of:

forming a polycrystalline semiconductor layer essentially comprising Si, Ge or SiGe, on a support substrate;

adding hydrogen to the polycrystalline semiconductor layer; and dissociating hydrogen in the polycrystalline semiconductor layer added with hydrogen by heating the polycrystalline semiconductor layer so that the number of monohydride structures of couplings between Si or Ge, and H is larger than the number of higher-order hydride structures.

2. A method of forming a polycrystalline semiconductor layer according to claim 1, wherein said hydrogen dissociating step performs a heat treatment at a temperature of 250° C. to 500° C. of the polycrystalline semiconductor layer.

3. A method of forming a polycrystalline semiconductor layer according to claim 1, wherein said hydrogen dissociating step heats the polycrystalline semiconductor layer in a hydrogen atmosphere.

4. A method of forming a polycrystalline semiconductor layer according to claim 1, wherein said hydrogen dissociating step heats the polycrystalline semiconductor layer in an atmosphere containing oxygen or water content.

5. A method of forming a polycrystalline semiconductor layer, comprising the steps of:

forming a polycrystalline semiconductor layer essentially comprising Si, Ge or SiGe, on a support substrate;

adding hydrogen to the polycrystalline semiconductor layer; and dissociating hydrogen of some hydride structures by heating the polycrystalline semiconductor layer added with hydrogen.

6. A method of forming a polycrystalline semiconductor layer according to claim 5, wherein said hydrogen dissociating step performs a heat treatment at a temperature of 250° C. to 500° C. of the polycrystalline semiconductor layer.

7. A method of forming a polycrystalline semiconductor layer according to claim 5, wherein said hydrogen dissociating step heats the polycrystalline semiconductor layer in a hydrogen atmosphere.

8. A method of forming a polycrystalline semiconductor layer according to claim 5, wherein said hydrogen dissociating step heats the polycrystalline semiconductor layer in an atmosphere containing oxygen or water content.

9. A method of evaluating a semiconductor device comprising the steps of:

irradiating a laser beam to a channel region of a thin film transistor formed on the surface of a transparent substrate, the channel region essentially comprising Si, Ge or SiGe; and comparing a peak intensity of a monohydride structure of couplings between Si or Ge, and H with a peak intensity of a higher-order hydride structure, through observation of spectra of light scattered from the channel region.

* * * * *